US011226246B2

(12) United States Patent
Xu et al.

(10) Patent No.: US 11,226,246 B2
(45) Date of Patent: Jan. 18, 2022

(54) NON-DESTRUCTIVE DETECTING DEVICE FOR COMPONENT RESIDUAL STRESS GRADIENT

(71) Applicant: BEIJING INSTITUTE OF TECHNOLOGY, Beijing (CN)

(72) Inventors: Chunguang Xu, Beijing (CN); Peng Yin, Beijing (CN); Zhixiang Li, Beijing (CN); Yuren Lu, Beijing (CN); Jianfeng Song, Beijing (CN); Wenyuan Song, Beijing (CN); Ruili Jia, Beijing (CN); Shuangyi Li, Beijing (CN)

(73) Assignee: BEIJING INSTITUTE OF TECHNOLOGY, Beijing (CN)

( * ) Notice: Subject to any disclaimer, the term of this patent is extended or adjusted under 35 U.S.C. 154(b) by 0 days.

(21) Appl. No.: 16/897,414

(22) Filed: Jun. 10, 2020

(65) Prior Publication Data
US 2021/0025769 A1    Jan. 28, 2021

(30) Foreign Application Priority Data

Jul. 24, 2019  (CN) .......................... 201910672400.X

(51) Int. Cl.
*G01L 1/25*     (2006.01)
*B81B 3/00*     (2006.01)

(52) U.S. Cl.
CPC ............ *G01L 1/255* (2013.01); *B81B 3/0072* (2013.01)

(58) Field of Classification Search
CPC .................................................... G01L 1/255
(Continued)

(56) References Cited

U.S. PATENT DOCUMENTS

2008/0245150 A1* 10/2008 Katayama .............. G01N 29/44
                                                      73/602
2015/0300897 A1* 10/2015 Xu ........................ G01N 29/041
                                                      73/597

OTHER PUBLICATIONS

Song et al. "Nondestructive testing and characterization of residual stress field using an ultrasonic method." Chinese Journal of Mechanical Engineering 29.2 (2016): 365-371. (Year: 2016).*

* cited by examiner

*Primary Examiner* — Walter L Lindsay, Jr.
*Assistant Examiner* — Philipmarcus T Fadul
(74) *Attorney, Agent, or Firm* — John A. Miller; Shumaker, Loop & Kendrick, LLP

(57) ABSTRACT

The present disclosure relates to the technical field of non-destructive detecting of residual stress, and in particular to a non-destructive detecting device for component residual stress gradient. the non-destructive detecting device comprises: groups of transmitting transducers and receiving transducers arranged symmetrically to each other, the transmitting transducers closer to the symmetry axis have greater excitation frequencies; an acoustic wedge coupled to the groups of transmitting transducers and receiving transducers, wherein groups of cylindrical transmitting tunnels and receiving tunnels are provided obliquely within the transmitting connection area and the receiving connection area through their top surfaces and toward their bottom surfaces, the transmitting transducers are coupled to the transmitting tunnels in a one-to-one correspondence, the receiving transducers are coupled to the receiving tunnels in a one-to-one correspondence, and the bottom surfaces of the transmitting connection area and the receiving connection area are pressed against the surface of the detected component; and a calculation processing module electrically connected to the transmitting transducers and the receiving transducers. The (Continued)

non-destructive detecting device solves the problem that the residual stress values of components at different penetration depths cannot be detected at the same time.

6 Claims, 4 Drawing Sheets

(58) Field of Classification Search
  USPC .......................................................... 73/584
  See application file for complete search history.

NON-DESTRUCTIVE DETECTING DEVICE FOR COMPONENT RESIDUAL STRESS GRADIENT

CROSS-REFERENCE TO RELATED APPLICATION

This application claims priority to Chinese Patent Application No. 201910672400.X, filed on Jul. 24, 2019 and titled "Non-destructive detecting device for component residual stress gradient", which is incorporated herein by reference in its entirety.

BACKGROUND

Field

The present disclosure relates to the technical field of non-destructive detecting of residual stress, and in particular to a non-destructive detecting device for component residual stress gradient.

Discussion

During the research on the performance of metal components and composite materials components, it was found that the residual stress has a great influence on the performance of strength, fatigue life and dimensional stability of the components. Therefore, the research on the detection of residual stress of the components is also very important. The detection of residual stress is divided into three types: non-destructive detection, micro-damage detection and damage detection. Both the damage detection and the micro-damage detection will cause more or less fatal and irreversible damage to the detected components, but the non-destructive detection can achieve no damage to the detected components during the detecting process. The ultrasonic non-destructive detecting method can be used. The ultrasonic non-destructive detecting method uses the acoustic elastic theory to determine the internal residual stress of the component. The basic principle is that the residual stress in the component affects the propagation speed of the ultrasonic acoustic wave. If it is compressive residual stress, the ultrasonic speed will become faster, and if it is tensile residual stress, the ultrasonic speed will become slower. The residual stress value in the component can be measured according to this principle.

Then, at present, in the application of the ultrasonic non-destructive detecting, there is no device and method that can simultaneously detect the residual stress values of the same component at different penetration depths, and can simultaneously obtain changes in the residual stress values of the same component at different gradient layers. Therefore, it is impossible to monitor the distribution of the residual stress in the component along the depth direction, and it is impossible to monitor and analyze the equilibrium state of the residual stress in the component.

SUMMARY

The present application provides a non-destructive detecting device for component residual stress gradient to solve the problem that the residual stress values of components at different penetration depths cannot be detected at the same time.

A non-destructive detecting device for component residual stress gradient provided by the present application comprising:

groups of transmitting transducers and receiving transducers, wherein one transmitting transducer and one receiving transducer arranged symmetrically to each other forms a group, symmetry axes of the groups coincide, the transmitting transducers of different groups have different excitation frequencies, and the transmitting transducers closer to the symmetry axis have greater excitation frequencies;

an acoustic wedge coupled to the groups of transmitting transducers and receiving transducers, wherein the acoustic wedge is divided into a transmitting connection area and a receiving connection area that are symmetrical in structure, groups of cylindrical transmitting tunnels and receiving tunnels having open top surfaces and closed bottom surfaces are provided obliquely within the transmitting connection area and the receiving connection area through their top surfaces and toward their bottom surfaces, an included angle between the bottom surfaces of the transmitting tunnels and the bottom surface of the transmitting connection area and an included angle between the bottom surfaces of the receiving tunnels and the receiving connection area are first critical angles, one transmitting tunnel and one receiving tunnel arranged symmetrically to each other forms a group, transmitting ends of the transmitting transducers are coupled to top portions of the transmitting tunnels in a one-to-one correspondence, and receiving ends of the receiving transducers are coupled to top portions of the receiving tunnels in a one-to-one correspondence, and the bottom surfaces of the transmitting connection area and the receiving connection area are pressed against a surface of a detected component, and contact surfaces between the detected component and the transmitting connection area and the receiving connection area are covered with a coupling agent; and a calculation processing module electrically connected to the groups of transmitting transducer and receiving transducer and configured for acquiring residual stress parameters and calculating residual stress magnitude.

Compared with the prior art, some embodiments of the present application provide groups of transmitting transducers and receiving transducers with different excitation frequencies and groups of obliquely arranged transmitting tunnels and receiving tunnels of the acoustic wedge coupled thereto in one-to-one correspondence, wherein the magnitudes of the residual stress of the detected component corresponding to the different penetration depths and the magnitudes of the residual stress at different penetration depth gradients can be obtained at the same time. Specifically the longitudinal ultrasonic waves emitted by the transmitting end of each group of transmitting transducers of the non-destructive detecting device pass through the corresponding transmitting tunnel in the acoustic wedge and enters the surface of the detected component from the bottom surface of the acoustic wedge at the first critical angle to generate an ultrasonic critical refracted longitudinal wave, and the ultrasonic critical refracted longitudinal wave enters a certain penetration depth inside the detected component and then passes through the bottom surface of the acoustic wedge and is received by the group of receiving transducers through the receiving tunnels. At the same time, the calculation processing module electrically connected to the transmitting transducer and the receiving transducer of the group can obtain the corresponding residual stress parameter, which can be an ultrasonic propagation time parameter, and then the residual stress of the penetration depth corresponding to the detected component can be calculated, further calculate the residual stress of each gradient. Due to different excitation frequencies, the penetration depth at which the ultrasonic longitudinal waves arrive in the detected component is different. The greater the excitation frequency is, the smaller the penetration depth is. The groups of transmitting transducers and receiving transducers and the groups of transmitting tunnels and receiving tunnels provided by the present application can simultaneously obtain the residual stresses at different penetration depths inside the detected component, and then obtain the residual stresses of different gradients inside the detected component. The non-destructive detecting device for component residual stress gradient provided by the present application solves the problem that the residual stress values of different penetration depths of components cannot be detected at the same time.

In some embodiments, a plane on which the bottom surface of the transmitting connection area is located is on the same plane as a plane on which the bottom surface of the receiving connection area is located; or the plane on which the bottom surface of the transmitting connection area is located and the plane on which the bottom surface of the receiving connection area is located intersect at an angle.

In this way, it can detect the detected component whose surface is flat but has vertical corners, and can ensure that the bottom surfaces of the transmitting connection area and the receiving connection area are pressed against and attached to the surface of the detected component to ensure the reliability of the detection result.

In some embodiments an area where extension lines of the transmitting tunnels intersects with the bottom surface of the transmitting connection area, and an area where extension lines of the receiving tunnels intersect with the bottom surface of the receiving connection area are each provided with a boss structure, and a bottom surface of the boss structure is pressed against the surface of the component.

When the contact area between the bottom surface of the acoustic wedge and the detected component is large, more coupling agent must be applied, and the coupling caused by more coupling agent will cause a larger measurement error, thus, it is necessary to reduce the contact area between the bottom surface of the acoustic wedge and the detected component as much as possible. Therefore, the arrangement of the boss structure can reduce the contact area between the bottom surface of the acoustic wedge and the detected component without reducing the energy of the incident ultrasonic longitudinal wave acoustic beam. This can not only improve the coupling reliability, but also greatly reduce the error caused by the deformation of the detected component.

In some embodiments, the bottom surface of the boss structure is a curved surface.

In this way, it can detect the detected component 2 whose surface is a curved structure, and can ensure that the bottom surfaces of the transmitting connection area 31 and the receiving connection area 32 are pressed against and attached to the surface of the detected component 2, to ensure reliability of the detection result.

In some embodiments, an annular screw thread is provided on an upper inner side wall of each of the transmitting tunnels and the receiving tunnels, which is screw-connected to the transmitting end of the corresponding transmitting transducer and the receiving end of the corresponding receiving transducer, respectively.

In this way, a good coupling between the transmitting tunnels and the transmitting transducers and a good coupling between the receiving tunnels and the receiving transducers can be further achieved.

In some embodiments, a cavity for filling with glycerin is provided in a lower part of each of the transmitting tunnels and the receiving tunnels.

The sealing performance is enhanced on the one hand, and on the other hand, the acoustic transmitting performance of the glycerin to the ultrasonic longitudinal waves is better than that of air to the ultrasonic longitudinal waves, which can improve the acoustic transmitting performance of the ultrasonic longitudinal waves, filter out other ultrasonic transverse waves, etc., so that more and stronger ultrasonic longitudinal waves are incident into the surface and inside of the detected component through the sealed cavity filled with the glycerin to obtain more accurate detection results.

In some embodiments the side wall of the cavity is provided with a vent hole and a sealing element for closing the vent hole.

In this way, after the cavity is filled up with the glycerin, during the process that the transmitting transducers and the receiving transducers are pressed against and coupled into the transmitting tunnels and the receiving tunnels, part of the overflowed glycerin can flow out from the vent hole on the side wall of the cavity, this can ensure that the cavity is filled up with the glycerin, to ensure its tightness, and to effectively avoid air bubbles caused by insufficient oil injection, thereby effectively preventing the ultrasonic longitudinal wave from propagating through the air, which greatly reduces the acoustic transmitting performance.

In some embodiments, an isolation cavity penetrating the top surface and the bottom surface of the acoustic wedge is provided between a group of transmitting tunnel and the receiving tunnel closest to the symmetry axis, a central axis of the isolation cavity coincides with the symmetry axis, and the isolation cavity is filled up with magnet material.

The isolation cavity filled up with magnet material can play a good role in acoustic insulation, ensure the accuracy of the detection result, and effectively prevent the first receiving transducer from receiving the acoustic wave signal transmitted from the inside of the acoustic transmitting wedge in a straight line with the shortest distance directly, thereby causing the receiving of the erroneous residual stress parameter of the detected component and resulting in an incorrect detection result.

In some embodiments, a distance between center points of the bottom surfaces of at least one group of transmitting tunnels and receiving tunnels is 15 mm-35 mm.

The data has been corrected through multiple experiments, so that the signal strength and stress resolution of the ultrasonic longitudinal wave can achieve better results and achieve a good unification.

In some embodiments, the acoustic wedge is made of organic glass material. This organic glass material is easy to process, has good mechanical properties, and can meet the processing requirements of different shapes of acoustic wedges; the attenuation coefficient is more suitable, that is, the acoustic energy entering the detected component through it is not greatly attenuated. Another advantage of the acoustic wedge made of organic material is that it has good acoustic coupling with the detected component, and with appropriate coupling agents, it is possible to achieve acoustic coupling conveniently and stably.

It should be understood that the above general description and the following detailed description are only exemplary and do not limit the present application.

REFERENCE SIGNS

Figure 1:
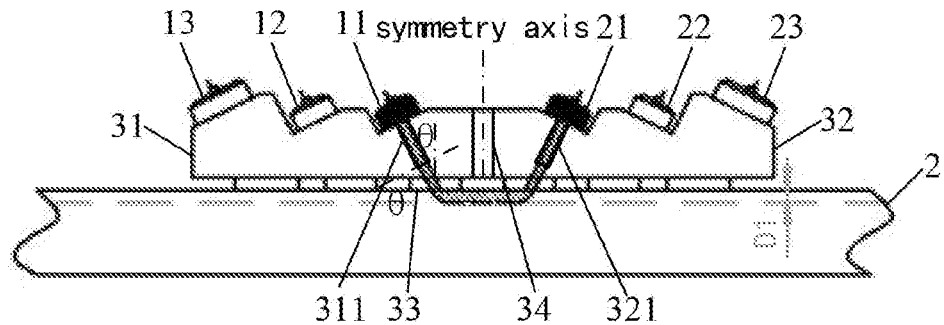
FIG. 1 is a usage state diagram of a first transmitting transducer and a first receiving transducer of a non-destructive detecting device according to a first embodiment of the present application.

11—first transmitting transducer;
12—second transmitting transducer;
13—third transmitting transducer;
21—first receiving transducer;
22—second receiving transducer;
23—third receiving transducer;
30—acoustic wedge;
31—transmitting connection area;
311—first transmitting tunnel;
312—second transmitting tunnel;
313—third transmitting tunnel;
32—receiving connection area;
321—first receiving tunnel;
322—second receiving tunnel;
323—third receiving tunnel;
33—boss structure;
34—isolation cavity;
2—detected component.

The drawings herein are incorporated into the specification and constitute a part of the specification, show embodiment consistent with the application, and are used to explain the principles of the application together with the specification.

DETAILED DESCRIPTION

The present application will be further described in detail below through specific embodiments and in conjunction with drawings.

As shown in FIGS. 1-11, the embodiments of the present application provide a non-destructive detecting device for component residual stress gradient (hereinafter referred to as a non-destructive detecting device), which comprises groups of transmitting transducers and receiving transducers. The transmitting transducer may specifically be an ultrasonic transducer, which is a device that converts input electrical power into mechanical power (i.e. ultrasonic wave) and transmits the same while only a small part of power is consumed by itself. The transmitting transducer may specifically be an ultrasonic transducer capable of transmitting an ultrasonic longitudinal wave. The receiving transducer may specifically be an ultrasonic transducer capable of receiving an ultrasonic critical refracted longitudinal wave and converting it into an electrical signal. One transmitting transducer and one receiving transducer arranged symmetrically to each other form a group, symmetry axes of the groups coincide, the transmitting transducers of different groups have different excitation frequencies, and the transmitting transducers closer to the symmetry axis have greater excitation frequencies. Taking three groups of transmitting transducers and receiving transducers as an example for description. A first transmitting transducer 11, a second transmitting transducer 12, and a third transmitting transducer 13 are sequentially arranged in one direction away from the symmetry axis, and a first receiving transducer 21, a second receiving transducer 22, and a third receiving transducer 23 are sequentially arranged in the other direction away from the symmetry axis. The excitation frequency of the first transmitting transducer 11 is greater than the excitation frequency of the second transmitting transducer 12, and the excitation frequency of the second transmitting transducer 12 is greater than the excitation frequency of the third transmitting transducer 13. In some embodiments, the excitation frequency of the first transmitting transducer 11 may be 10 MHz, the excitation frequency of the second transmitting transducer 12 may be 5 MHz, and the excitation frequency of the third transmitting transducer 13 may be 2.5 MHz.

The non-destructive detecting device according to some embodiments of the present application may further include an acoustic wedge 30 coupled to the aforementioned groups of transmitting transducers and receiving transducers. In order to obtain a good waveform and sufficient acoustic energy in the detected component 2, the acoustic impedance of the material of the acoustic wedge 30 matches the acoustic impedance of the detected component 2, and the material of the acoustic wedge 30 has a low acoustic attenuation rate, and the acoustic velocity of the longitudinal wave propagating in the acoustic wedge 30 is lower than the longitudinal acoustic velocity of the detected component 2. In addition, the material of the acoustic wedge 30 also has good mechanical properties to meet the processing requirements of different shapes of the acoustic wedge 30; based on this, the acoustic wedge 30 can be made of organic glass, and the chemical name of organic glass is polymethyl methacrylate, which is a polymer compound polymerized by methacrylate. This material is easy to process, and its attenuation coefficient is more suitable, that is, the acoustic energy entering the detected component 2 through it is not greatly attenuated. Another advantage of the acoustic wedge 30 made of organic glass material is that it has good acoustic coupling with the detected component 2, and through appropriate coupling agent, acoustic coupling can be achieved conveniently and stably.

The aforementioned acoustic wedge 30 can be divided into two parts symmetrical in structure, i.e., a transmitting connection area 31 and a receiving connection area 32. Groups of cylindrical transmitting tunnels and receiving tunnels having open top surfaces and closed bottom surfaces are provided obliquely within the transmitting connection 31 area and the receiving connection area 32 through their top surfaces and toward their bottom surfaces. A top surface and a bottom surface of each of the cylindrical transmitting tunnels and the receiving tunnels are parallel to each other. An included angle between the bottom surface of each of the transmitting tunnels and the bottom surface of the transmitting connection area and an included angle between the bottom surface of each of the receiving tunnels and the receiving connection area are first critical angles. One transmitting tunnel and one receiving tunnel arranged symmetrically to each other form a group. The length of each transmitting tunnel and each receiving tunnel may be equal or the distance from the bottom surface of each transmitting tunnel to the transmitting connection area 31 and the distance from the bottom surface of each receiving tunnel to the receiving connection area 32 are equal. This can ensure that the acoustic path L does not change, thereby ensuring that the acoustic attenuation of the ultrasonic longitudinal wave is the same. In some embodiment, the length can be 25 mm±10 mm, that is, between 15 mm and 35 mm. The data has been corrected through multiple experiments, so that the signal strength and stress resolution of the ultrasonic longitudinal wave can achieve better results and achieve a good unification.

Transmitting ends of the aforementioned transmitting transducers are coupled to top portions of the transmitting tunnels in a one-to-one correspondence, and receiving ends of the receiving transducers are coupled to top portions of the receiving tunnels in a one-to-one correspondence. Taking three groups of transmitting tunnels and receiving tunnels as an example for specific description. A first transmitting tunnel 311, a second transmitting tunnel 312, and a third transmitting tunnel 313 can be arranged in the transmitting connection area 31 along the direction away from the symmetry axis, and a first receiving tunnel 321, a second receiving tunnel 322, and a third receiving tunnel 323 can be arranged in the receiving connection area 32 along the direction away from the symmetry axis. The bottom surfaces of the transmitting connection area 31 and receiving connection area 32 are pressed against the surface of the detected component 2, and the contact surfaces of the two are covered with coupling agent. In some embodiment, the area where the extension line of each transmitting tunnel intersects the bottom surface of the transmitting connection area, and the area where the extension line of each receiving tunnel intersects the bottom surface of the receiving connection area are provided with a boss structure 33. The bottom surface of the boss structure 33 can be evenly coated with the coupling agent, and the bottom surface is pressed against the surface of the detected component 2. When the contact area between the bottom surface of the acoustic wedge 30 and the detected component 2 is large, more coupling agent must be applied, and the coupling caused by more coupling agent will cause a larger measurement error, thus, it is necessary to reduce the contact area between the bottom surface of the acoustic wedge 30 and the detected component 2 as much as possible. Therefore, the arrangement of the boss structure 33 can reduce the contact area between the bottom surface of the acoustic wedge 30 and the detected component 2 without reducing the energy of the incident ultrasonic longitudinal wave acoustic beam. This can not only improve the coupling reliability, but also greatly reduce the error caused by the deformation of the detected component 2.

The non-destructive detecting device according to some embodiments of the present application further includes a calculation processing module electrically connected to the foregoing groups of transmitting transducers and receiving transducers, and the calculation processing module is used to obtain residual stress parameters (specifically, ultrasonic propagation time parameter) and calculate the residual stress magnitude. Specifically, according to Snell's law, the longitudinal ultrasonic waves emitted by the transmitting end of each group of transmitting transducers of the non-destructive detecting device according to some embodiments of the present application pass through the corresponding transmitting tunnel in the acoustic wedge 30 and enters the surface of the detected component 2 from the bottom surface of the acoustic wedge 30 at the first critical angle to generate an ultrasonic critical refracted longitudinal wave (LCR wave), and the ultrasonic critical refracted longitudinal wave enters a certain penetration depth inside the detected component 2 and then passes through the bottom surface of the acoustic wedge 30 and is received by the group of receiving transducers through the receiving tunnels. At the same time, the aforementioned calculation processing module electrically connected to the transmitting transducer and the receiving transducer of the group can obtain the corresponding residual stress parameter, which can be an ultrasonic propagation time parameter, and then the residual stress of the penetration depth corresponding to the detected component 2 can be calculated. The groups of transmitting transducers and receiving transducers and the groups of transmitting tunnels and receiving tunnels can simultaneously obtain the residual stresses at different penetration depths inside the detected component 2 respectively, and thus the residual stresses of different gradients inside the detected component 2 can be obtained.

Specifically, according to the principle of acoustic elasticity, that is, the residual stress in the detected component 2 will affect the ultrasonic longitudinal wave propagation velocity, and when the residual stress direction is consistent with the ultrasonic longitudinal wave direction, the tensile stress will slow down the ultrasonic longitudinal wave propagation velocity v or extend the propagation time t, and the compressive stress will increase the ultrasonic longitudinal wave propagation velocity v or shorten the propagation time t. Then when the distance between the transmitting transducers in each group and the receiving transducers in the group is constant, or the acoustic path L is constant, the ultrasonic propagation time $t_0$ of the zero-stress detected block is measured first, and the ultrasonic propagation time t of the detected component 2 is then measured. The residual stress value σ of the detected component 2 can then be calculated according to the time difference between the two, and the corresponding calculation formula (1) is:

$$\sigma - \sigma_0 = K(t - t_0), \quad (1)$$

in the formula, σ is the residual stress value of the detected component; $\sigma_0$ is the stress value of the zero-stress detected block, which is 0; t is the ultrasonic propagation time t of the detected component; $t_0$ is the ultrasonic propagation time of the zero-stress detected block; and K is the stress coefficient, which is related to the material of the detected component and the distance between the transmitting transducer and the receiving transducer and can be obtained by tensile test calibration.

The aforementioned zero-stress detected block needs to use the same material as the metallographic structure and surface roughness of the detected component 2. The ultrasonic propagation time $t_0$ of the zero-stress detected block can be obtained by an ultrasonic recording detector. The calculation processing module mentioned in the previous embodiment is designed by the above principle. By inputting the ultrasonic propagation time $t_0$ of the zero-stress detected block into the calculation processing module, the residual stress value of the detected component 2 at each position can be obtained.

Taking the center frequency (i.e. excitation frequency) $f=0.5\sim25$ MHz of commonly used ultrasonic transducers as an example, the penetration depth D of the LCR wave and the center frequency f satisfy the following calculation formula (2):

$$D = \alpha_s \times f^{-0.96}, \tag{2}$$

in the formula, D is the penetration dept (mm); f is the center frequency of the ultrasonic transducer (MHz); $\alpha_s$ is a correction factor of the penetration depth, which is dimensionless, and obtained through experiments for example, wherein it is 5.90 for steel, 6.40 for aluminium and 4.81 for copper.

According to the above calculation formulas (1) and (2), and the center frequencies $f_1$, $f_2$, and $f_3$ of the first transmitting transducer 11, the second transmitting transducer 12 and the third transmitting transducer 13, as well as the corresponding ultrasonic propagation times $t_1$, $t_2$ and $t_3$ of each group, the residual stress values $\sigma_1$, $\sigma_2$ and $\sigma_3$ of each group and the penetration depth $D_1$, $D_2$ and $D_3$ of each group can be obtained respectively. Through further calculations, the residual stress gradients $\sigma_1$, $\sigma_{1-2}$, and $\sigma_{2-3}$ corresponding to the gradients $D_1$, $D_{1-2}$, and $D_{2-3}$ perpendicular to the direction of the material surface can be determined.

Wherein, the calculation formula (3-1) for the residual stress $\sigma_{1-2}$ at the depth of $D_{1-2}$ can be as follows.

$$\sigma_{1-2} = \frac{\sigma_2 \times (D_2 Ld) - \sigma_1 \times (D_1 Ld)}{D_2 Ld - D_1 Ld} \tag{3-1}$$

Since the acoustic path L and the wafer diameter d of the transducer do not change under normal circumstances, the formula (3-1) can be simplified as follows.

$$\sigma_{1-2} = \frac{\sigma_2 D_2 - \sigma_1 D_1}{D_2 - D_1} \tag{3-2}$$

Similarly, the calculation formula (3-3) for the residual stress $\sigma_{2-3}$ at the depth of $D_{2-3}$ can be as follows.

$$\sigma_{2-3} = \frac{\sigma_3 D_3 - \sigma_2 D_2}{D_3 - D_2} \tag{3-3}$$

By analogy, if the center frequencies of the transmitting transducers is $f_1, f_2 \ldots f_n$ from large to small, the corresponding detection depths are $D_1, D_2 \ldots D_1$, respectively. The calculation formula for the residual stress $\sigma_{i-g}$ at any depth gradient $D_{i-j}$ is as follows.

$$\sigma_{i-j} = \frac{\sigma_j f_j^{-0.96} - \sigma_i f_i^{-0.96}}{f_j^{-0.96} - f_i^{-0.96}} \tag{3-5}$$

Compared with the prior art, some embodiments of the present application provide groups of transmitting transducers and receiving transducers with different excitation frequencies and groups of obliquely arranged transmitting tunnels and receiving tunnels of the acoustic wedge coupled thereto in one-to-one correspondence, wherein the magnitudes of the residual stress of the detected component 2 corresponding to the different penetration depths and the magnitudes of the residual stress at different penetration depth gradients can be obtained at the same time. Due to different excitation frequencies, the penetration depth at which the ultrasonic longitudinal waves arrive in the detected component is different. In some embodiment, the greater the excitation frequency is, the smaller the penetration depth is. The groups of transmitting transducers and receiving transducers and the groups of transmitting tunnels and receiving tunnels can simultaneously obtain the residual stresses at different penetration depths inside the detected component, and then obtain the residual stresses of different gradients inside the detected component.

Figure 2:
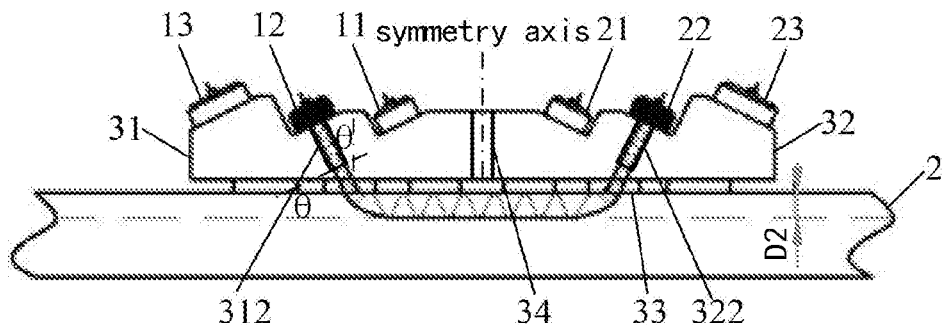
FIG. 2 is a usage state diagram of a second transmitting transducer and a second receiving transducer of the non-destructive detecting device according to the first embodiment of the present application.
Figure 3:
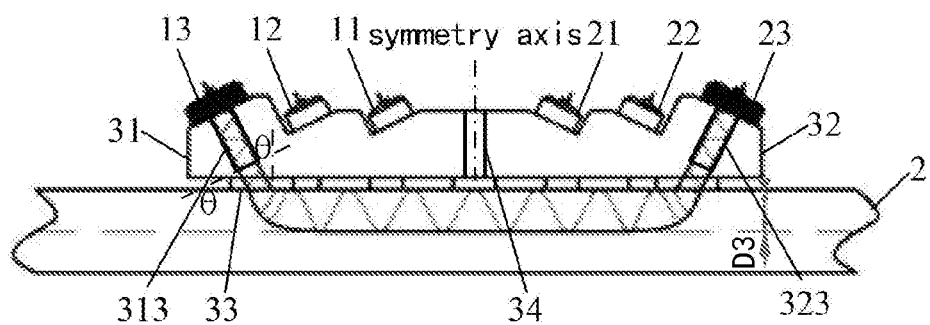
FIG. 3 is a usage state diagram of a third transmitting transducer and a third receiving transducer of the non-destructive detecting device according to the first embodiment of the present application.

As shown in FIGS. 1-3, in the first embodiment of the present application, the plane on which the bottom surface of the transmitting connection area 31 is located and the plane on which the bottom surface of the receiving connection area 32 is located are on the same plane. In this way, it can detect the detected component 2 whose surface is a straight structure, and can ensure that the bottom surfaces of the transmitting connection area 31 and the receiving connection area 32 are pressed against and attached to the surface of the detected component 2 to ensure the reliability of the detection result.

Figure 4:
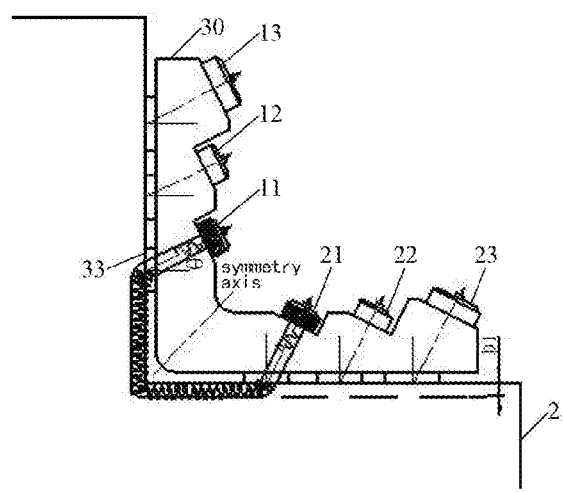
FIG. 4 is a usage state diagram of a first transmitting transducer and a first receiving transducer of a non-destructive detecting device according to a second embodiment of the present application.
Figure 5:
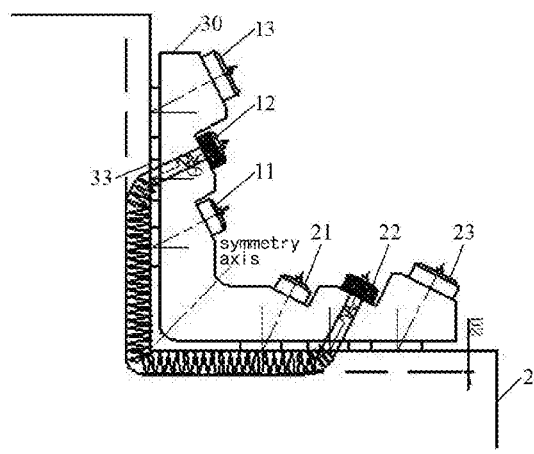
FIG. 5 is a usage state diagram of a second transmitting transducer and a second receiving transducer of the non-destructive detecting device according to the second embodiment of the present application.
Figure 6:
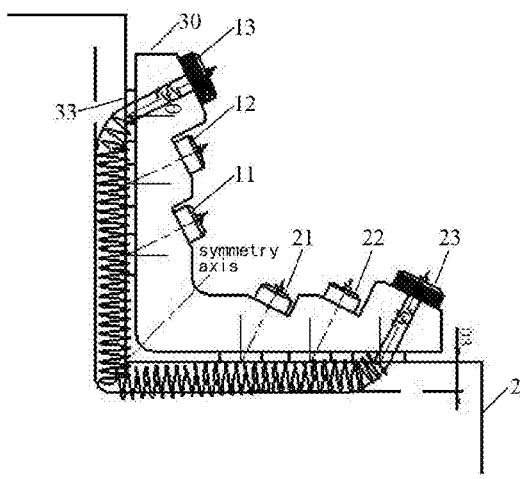
FIG. 6 is a usage state diagram of a third transmitting transducer and a third receiving transducer of the non-destructive detecting device according to the second embodiment of the present application.
Figure 7:
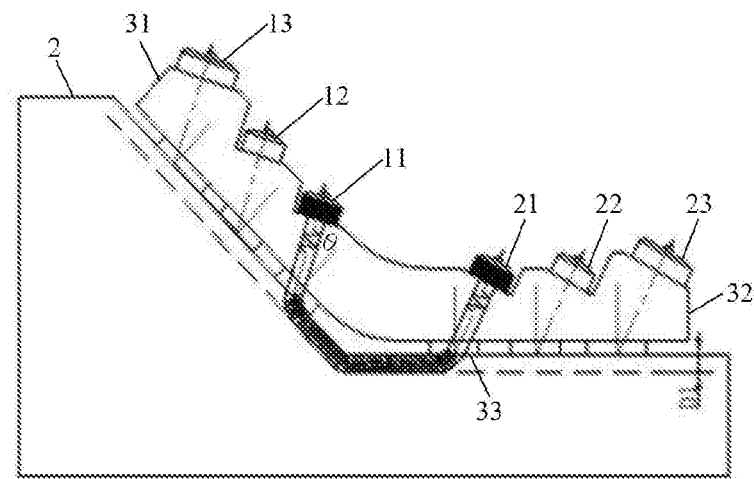
FIG. 7 is a usage state diagram of a first transmitting transducer and a first receiving transducer of a non-destructive detecting device according to a third embodiment of the present application.
Figure 8:
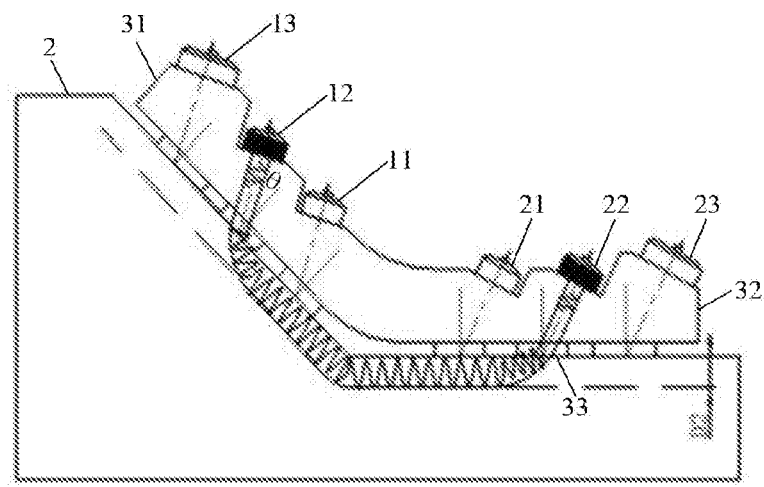
FIG. 8 is a usage state diagram of a second transmitting transducer and a second receiving transducer of the non-destructive detecting device according to the third embodiment of the present application.
Figure 9:
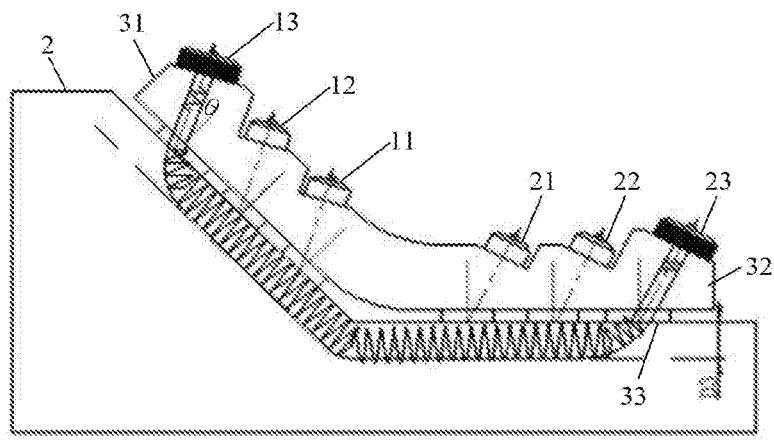
FIG. 9 is a usage state diagram of a third transmitting transducer and a third receiving transducer of the non-destructive detecting device according to the third embodiment of the present application.

The plane on which the bottom surface of the transmitting connection area 31 is located and the plane on which the bottom surface of the receiving connection area 32 is located can also intersect at an angle. As shown in FIGS. 4-6, in the second embodiment of the present application, the angle at which the plane where the bottom surface of the transmitting connection area 31 is located and the plane where the bottom surface of the receiving connection area 32 is located intersect is 90 degrees. In this way, it can detect the detected component 2 whose surface is flat but has vertical corners, and can ensure that the bottom surfaces of the transmitting connection area 31 and the receiving connection area 32 are pressed against and attached to the surface of the detected component 2 to ensure the reliability of the detection result. As shown in FIGS. 7-9, in the third embodiment of the present application, the angle at which the plane where the bottom surface of the transmitting connection area 31 is located and the plane where the bottom surface of the receiving connection area 32 is located intersect is an obtuse angle. In this way, it can detect the detected component 2 whose surface is flat surface but has obtuse corners, and can ensure that the bottom surfaces of the transmitting connection area 31 and the receiving connection area 32 are pressed against and attached to the surface of the detected component 2, to ensure the reliability of the detection result.

Figure 10:
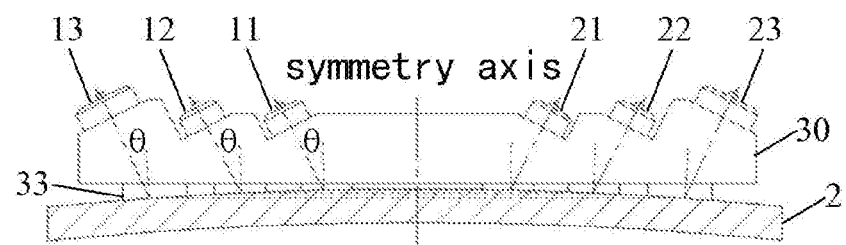
FIG. 10 is a usage state diagram of a non-destructive detecting device according to a fourth embodiment of the present application.
Figure 11:
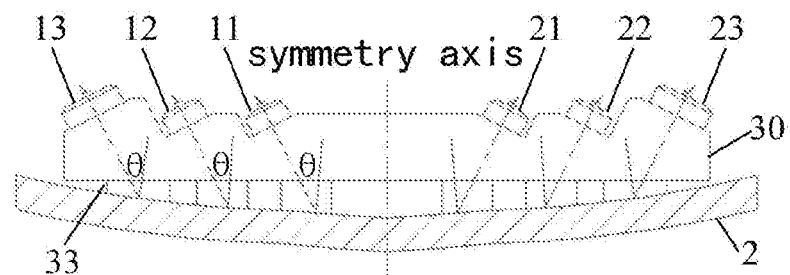
FIG. 11 is a usage state diagram of a non-destructive detecting device according to a fifth embodiment of the present application.

The bottom surface of the acoustic wedge 30 may also be a curved surface, that is, the bottom surface of the aforementioned boss structure 33 may be a curved surface. In this way, it can detect the detected component 2 whose surface is a curved structure, and can ensure that the bottom surfaces of the transmitting connection area 31 and the receiving connection area 32 are pressed against and attached to the surface of the detected component 2, to ensure reliability of the detection result. As shown in FIG. 10, in the fourth embodiment of the present application, the surface of the detected component 2 is a convex curved surface. As shown in FIG. 11, in the fifth embodiment of the present application, the surface of the detected component 2 is a concave curved surface.

It can be known from the above five embodiments that the bottom surface structure of the acoustic wedge 30 provided by the present application can be made according to the structural characteristics of the surface of the detected component 2 to ensure that the bottom surface of the acoustic wedge 30 is pressed against and attached to the surface of the detected component 2 to ensure the reliability of the detection results.

In order to achieve a good coupling between the transmitting tunnels and the transmitting transducers and a good coupling between the receiving tunnels and the receiving transducers, an annular screw thread may be provided on the upper inner side wall of each transmitting tunnel and each receiving tunnel, and are respectively screw-connected with the transmitting end of the corresponding transmitting transducer and the receiving end of the corresponding receiving transducer.

In order to further ensure a good sealing effect of the transmitting tunnels and the receiving tunnels, glycerin can be filled in them. Specifically, a cavity for filling with the glycerin can be provided in the lower parts of the transmitting tunnels and the receiving tunnels. Before coupling the transmitting tunnels and the receiving tunnels with the transmitting transducers and the receiving transducers, the glycerin is injected into the cavity, and after the cavity is fill up with the glycerin, the transmitting transducers and the receiving transducers is pressed into the transmitting tunnels and the receiving tunnels to couple thereto, so that the sealing effect of the coupled connection is better. With the above configuration, the sealing performance is enhanced on the one hand, and on the other hand, the acoustic transmitting performance of the glycerin to the ultrasonic longitudinal waves is better than that of air to the ultrasonic longitudinal waves, which can improve the acoustic transmitting performance of the ultrasonic longitudinal waves, filter out other ultrasonic transverse waves, etc., so that more and stronger ultrasonic longitudinal waves are incident into the surface and inside of the detected component 2 through the sealed cavity filled with the glycerin to obtain more accurate detection results. Further, the side wall of the cavity may also be provided with a vent hole and a sealing element closing the vent hole. In this way, after the cavity is filled up with the glycerin, during the process that the transmitting transducers and the receiving transducers are pressed against and coupled into the transmitting tunnels and the receiving tunnels, part of the overflowed glycerin can flow out from the vent hole on the side wall of the cavity, this can ensure that the cavity is filled up with the glycerin, to ensure its tightness, and to effectively avoid air bubbles caused by insufficient oil injection, thereby effectively preventing the ultrasonic longitudinal wave from propagating through the air, which greatly reduces the acoustic transmitting performance.

In some embodiments, an isolation cavity 34 penetrating the top and bottom surfaces of the acoustic wedge 30 may be provided between a group of transmitting tunnels and receiving tunnels closest to the symmetry axis, that is, between the first transmitting tunnel 311 and the first receiving tunnel 321. The central axis of the isolation cavity 34 coincides with the symmetry axis, and the isolation cavity 34 can be filled up with magnet material. The isolation cavity 34 filled up with magnet material can play a good role in acoustic insulation, ensure the accuracy of the detection result, and effectively prevent the first receiving transducer 21 from receiving the acoustic wave signal transmitted from the inside of the acoustic transmitting wedge 30 in a straight line with the shortest distance directly, thereby causing the receiving of the erroneous residual stress parameter of the detected component 2 and resulting in an incorrect detection result.

The above are only some embodiments of the present application, and are not intended to limit the present application. For those skilled in the art, the present application may have various modifications and changes. Any modification, equivalent replacement, improvement, etc. within the spirit and principle of this application shall be included in the protection scope of this application.

What is claimed is:

1. A non-destructive detecting device for component residual stress gradient, comprising:
   groups of transmitting transducers and receiving transducers, wherein one transmitting transducer and one receiving transducer that are arranged symmetrically to each other forms one group, symmetry axes of the groups coincide, the transmitting transducers of different groups have different excitation frequencies, the transmitting transducers closer to the symmetry axis have greater excitation frequencies, and the groups of transmitting transducers and receiving transducers are located within a common plane perpendicular to a surface of a detected component;
   an acoustic wedge coupled to the groups of transmitting transducers and receiving transducers,
   wherein the acoustic wedge is divided into a transmitting connection area and a receiving connection area that are symmetrical in structure, groups of cylindrical transmitting tunnels and receiving tunnels having open top surfaces and closed bottom surfaces are provided obliquely within the transmitting connection area and the receiving connection area through their top surfaces and toward their bottom surfaces, an included angle between the bottom surfaces of the transmitting tunnels and the bottom surface of the transmitting connection area and an included angle between the bottom surfaces of the receiving tunnels and the receiving connection area are first critical angles, one transmitting tunnel and one receiving tunnel arranged symmetrically to each other forms one group, transmitting ends of the transmitting transducers are coupled to top portions of the transmitting tunnels in a one-to-one correspondence, and receiving ends of the receiving transducers are coupled to top portions of the receiving tunnels in a one-to-one correspondence, and
   the bottom surfaces of the transmitting connection area and the receiving connection area are pressed against the surface of the detected component, and contact surfaces between the detected component and the transmitting connection area and the receiving connection area are covered with a coupling agent; and
   a calculation processing module electrically connected to the groups of transmitting transducers and receiving transducers and configured for acquiring residual stress parameters and calculating residual stress magnitude, wherein an annular screw thread is provided on an upper inner side wall of each of the transmitting tunnels and the receiving tunnels, which is screw-connected to the transmitting end of the corresponding transmitting transducer and the receiving end of the corresponding receiving transducer, respectively, wherein a cavity for filling with glycerin is provided in a lower part of each of the transmitting tunnels and the receiving tunnels, wherein a side wall of the cavity is provided with a vent hole from which part of overflowed glycerin can flow out of when the transmitting transducers and the receiving transducers are pressed against and coupled into the transmitting tunnels and the receiving tunnels and a sealing element for closing the vent hole.

2. The non-destructive detecting device according to claim 1, wherein, a plane on which the bottom surface of the transmitting connection area is located is on the same plane as a plane on which the bottom surface of the receiving connection area is located; or the plane on which the bottom surface of the transmitting connection area is located and the plane on which the bottom surface of the receiving connection area is located intersect at an angle.

3. The non-destructive detecting device according to claim 2, wherein, an area where extension lines of the transmitting tunnels intersects with the bottom surface of the transmitting connection area, and an area where extension lines of the receiving tunnels intersect with the bottom surface of the receiving connection area are each provided with a boss structure, and a bottom surface of the boss structure is pressed against the surface of the component.

4. The non-destructive detecting device according to claim 3, wherein, the bottom surface of the boss structure is a curved surface.

5. The non-destructive detecting device according to claim 1, wherein, an isolation cavity penetrating the top surface and the bottom surface of the acoustic wedge is provided between a group of transmitting tunnel and the receiving tunnel closest to the symmetry axis, a central axis of the isolation cavity coincides with the symmetry axis, and the isolation cavity is filled up with magnet material.

6. The non-destructive detecting device according to claim 1, wherein the acoustic wedge is made of organic glass material.

* * * * *